United States Patent [19]
Lin et al.

[11] Patent Number: 5,101,379

[45] Date of Patent: * Mar. 31, 1992

[54] APPARATUS FOR PAGE MODE PROGRAMMING OF AN EEPROM CELL ARRAY WITH FALSE LOADING PROTECTION

[75] Inventors: Tien-Ler Lin, Sunnyvale; Dumitru Cioaca, Cupertino, both of Calif.

[73] Assignee: SEEQ Technology, Incorporated, San Jose, Calif.

[*] Notice: The portion of the term of this patent subsequent to Nov. 15, 2005 has been disclaimed.

[21] Appl. No.: 551,642

[22] Filed: Jul. 10, 1990

Related U.S. Application Data

[63] Continuation of Ser. No. 269,197, Nov. 9, 1988, abandoned, which is a continuation of Ser. No. 868,114, May 27, 1986, Pat. No. 4,785,424.

[51] Int. Cl.$^5$ .............................................. G11C 16/06
[52] U.S. Cl. .................... 365/185; 365/238.5; 365/195
[58] Field of Search ........... 365/104, 184, 185, 189.05, 365/195, 204, 205, 207, 208, 230.01, 233, 238.5

[56] References Cited

U.S. PATENT DOCUMENTS

| | | | |
|---|---|---|---|
| 4,460,982 | 7/1984 | Gee et al. | 365/218 |
| 4,599,707 | 7/1986 | Fang | 365/195 |
| 4,694,427 | 9/1987 | Miyamoto et al. | 365/185 |
| 4,725,984 | 2/1988 | Ip et al. | 365/185 |
| 4,730,274 | 3/1988 | Edwards | 365/185 |
| 4,785,424 | 11/1988 | Lin et al. | 365/230 |

FOREIGN PATENT DOCUMENTS 0134390  10/1981  Japan ................................. 365/104

OTHER PUBLICATIONS

Mehrotra, "A 64Kb CMOS EEPROM with On-Chip ECC", IEEE ISSCC, Feb. 23, 1984, pp. 142-143, 328.

*Primary Examiner*—Glenn Gossage
*Attorney, Agent, or Firm*—Kenneth D'Alessandro

[57] ABSTRACT

An apparatus for page mode programming of an EEPROM cell array with false loading protection is disclosed. The system includes a flip-flop operatively connected to a bit line for storing information to be loaded into an EEPROM memory cell, and false loading protection circuitry operatively connected to the bit line for preventing the false loading of an erroneous signal into the flip-flop and/or an EEPROM cell.

1 Claim, 1 Drawing Sheet

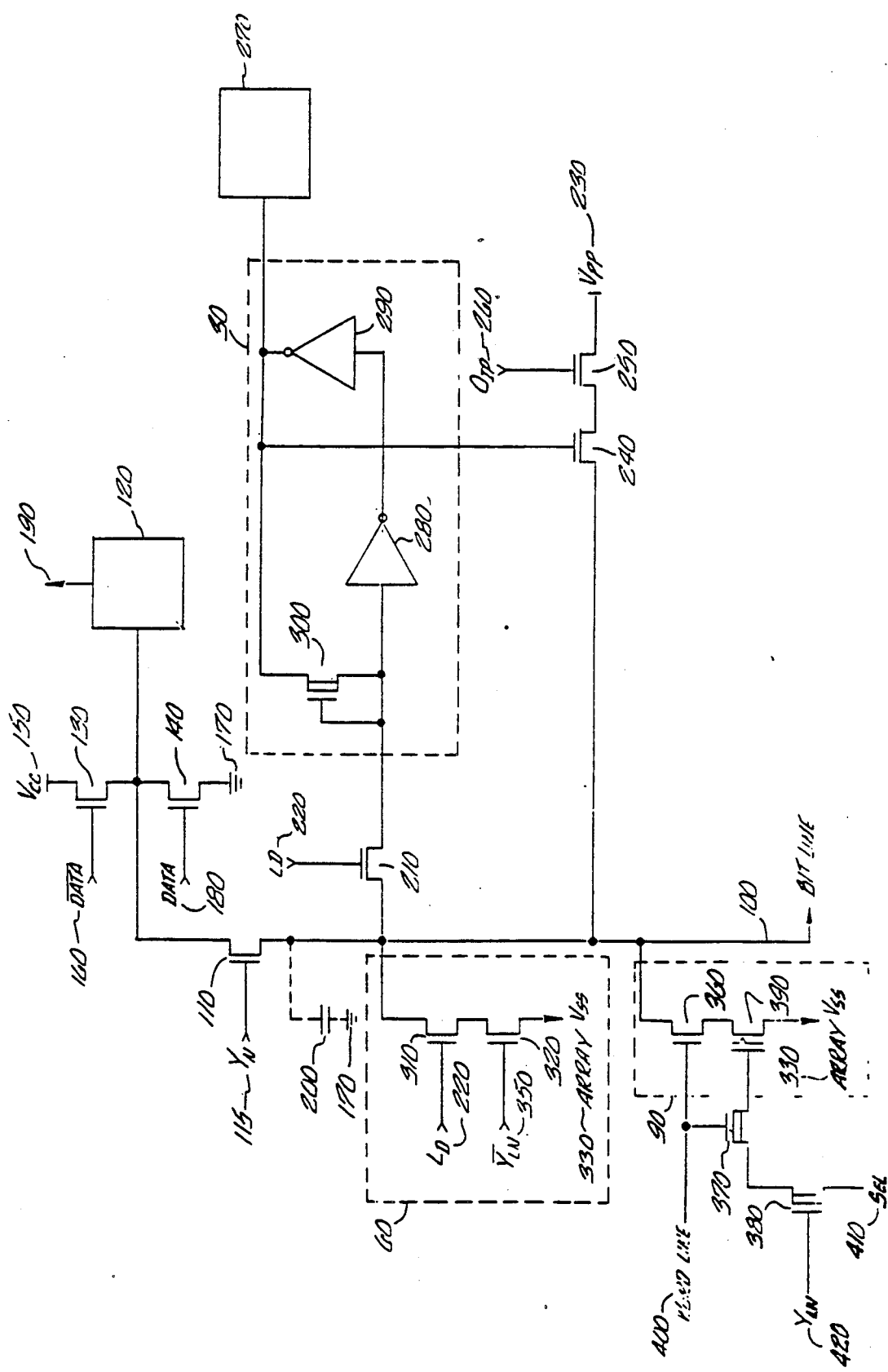

APPARATUS FOR PAGE MODE PROGRAMMING OF AN EEPROM CELL ARRAY WITH FALSE LOADING PROTECTION

This is a continuation of co-pending application(s) Ser. No. 269,197 filed on Nov. 9, 1988, now abandoned which is a continuation of Ser. No. 868,114, filed May 27, 1986, now U.S. Pat. No. 4,785,424.

FIELD OF THE INVENTION

The present invention relates to semiconductor memories and is more particularly directed to an apparatus for page mode programming of an EEPROM Cell Array with false loading protection.

BACKGROUND OF THE INVENTION

The use of EEPROM Semiconductor memories has grown considerably in recent years. A typical EEPROM memory device contains a two-dimensional array of memory cells. Each cell is associated with one bit of memory. The number of cells in a typical array is a function of the size of the array. Thus, in a 256K bit memory, there will typically be 512 columns of cells, each column in turn containing 512 cells. That is, there will be 512 columns and 512 rows of cells.

Each cell in a memory array comprises a place where information can be stored. By causing a memory cell to conduct or not conduct when it is tested for conduction during a read mode, the bit of memory associated with that cell can be caused to contain a "0" or "1" in binary code. The conditions in the cell which determine whether the cell will conduct or not conduct during the read mode are set during a write mode. The process in which these conditions are set is often called "writing to" the cell. The process of determining what binary code is stored in the cell, carried on during the read mode, is often called "reading from" the cell.

Writing to, and reading from, the memory cells is accomplished by changing the inputs to various transistors within the cell at various times. Each column of memory cells in an array of cells has associated with it a bit line, which bit line is connected to each cell in the column. Likewise, each row of memory cells in an EEPROM memory cell array has associated with it a word line, which word line is connected to each cell in the row. Thus, any particular cell in the array can be identified by referring to the word line that is associated with the row in which that cell is located and the bit line associated with the column in which that cell is located. Since the array is two-dimensional, each such selection will refer to a unique cell.

In order to place data to be stored into a memory cell onto the appropriate bit line, each bit line has data input means associated with it. In the conventional array, these data input means are associated in groups of eight, eight bits comprising a byte. In practice, the data input means into the various bit lines are operatively connected to data input buffers, which route incoming data into the appropriate bit line within the appropriate byte and into the appropriate cell on the appropriate word line.

In order to read the memory cell, each bit line is operatively connected to a sense amplifier. The sense amplifier detects the flow or non-flow of current in the bit line when a semiconductor memory cell is read. It then produces and transmits a signal to an output buffer, the signal's amplitude depending upon whether current is detected or not detected when the cell is read. The output buffer is operatively connected to an input/output pin ("I/O pin") which transmits the data from the multitude of cells in a semiconductor memory array.

In the conventional method of loading data into a semiconductor memory array, data is loaded a byte at a time. This method of writing data is called byte mode programming. In byte mode programming, the byte to be loaded is addressed, data to be loaded into the selected byte is loaded into the data-in buffer, the particular byte that has been selected is cleared, and the selected cells within the byte are written to according to the data in the data-in buffer. It can be seen that being limited to writing one byte at a time then means that it takes a considerable amount of time to write an entire 256K bit memory array.

It is desired to build an apparatus that is capable of programming an entire row in a memory array at one time. It is desired to build an apparatus by which the information stored at any particular bit in a memory array row can be changed without changing the information stored in the other bits in the memory array row.

The word line associated with any particular memory array row is called a "page boundary," and any cell within the row associated with that page boundary is "within the page boundary." It is desired to be able to write to any or all cells within a particular page boundary in one write period. This is called page mode programming, since an entire page may be written at once. It can be seen to one skilled in the art that since there are, in a 256K bit memory array, only 512 pages as opposed to 4,096 bytes, then page mode programming can be much faster than byte mode programming.

In page mode programming, a temporary storage means, usually a flip-flop, is associated with each bit line in the memory array. In loading, data to be loaded to a cell located on a particular bit line is transmitted to the appropriate bit line through the y-pass device associated with that bit line. The data to be loaded is then stored in the flip-flop associated with that particular bit line. All cells to be loaded within the particular page boundary are then cleared, and the entire page associated with a particular word line is written. This is repeated for different pages as many times as desired in any order desired until all of the cells in which new information is desired to be stored have been programmed with the desired information.

The use of the flip-flop associated with the memory array bit line, however, creates a problem. Because of inherent capacitance on each bit line in a memory array, after the read mode charge can get trapped on the bit line of an "unselected cell." An unselected cell being a cell into which it is not desired to load new data. If a write mode then follows the read mode, the trapped charge on the bit line can be felt at the flip-flop input during loading (at the beginning sequence of the write mode), thus causing the flip-flop output to go high, even though it was desired that the flip-flop output go low. Then, during the completion of the write mode, the memory cell may be written as if the memory cell were supposed to store a binary "0" (which corresponds to a high flip-flip output), when it actually was desired to store a binary "1" in the memory cell (corresponding to a low flip-flop output).

SUMMARY OF THE INVENTION

The present invention provides a solution to this problem, whereby charge that is trapped on a bit line during the read mode, and thereby would cause the associated flip-flop output to go high, can be drained off the bit line during the loading sequence of the page mode if no cell associated with that bit line is selected to be written.

It is desired to build an apparatus for page mode programming for a semiconductor memory array.

It is further desired to build an apparatus for preventing the false loading of a memory cell during page mode programming.

It is yet another object of the present invention to provide an apparatus for programming an EEPROM memory cell that is fast and accurate.

BRIEF DESCRIPTION OF THE DRAWINGS

The FIGURE shows a schematic diagram of a portion of an EEPROM memory array and associated circuitry comprising the preferred embodiment of the present invention.

DETAILED DESCRIPTION OF THE PREFERRED EMBODIMENT

This discussion describes a presently preferred embodiment of the invention. It will be understood to one skilled in the art that other embodiments of the present invention are also possible. This description will first describe the environment in which the preferred embodiment of the present invention operates.

Referring to the FIGURE, there is shown temporary storage means in the form of flip-flop storage means 30, means for preventing false loading 60, and floating gate EEPROM memory cell storage means 90. Bit line 100 runs the length of a column of memory cells in the semiconductor memory array. Bit line 100 is connected to the source of first MOSFET ("Metal Oxide Semiconductor Field Effect Transistor") 110. First MOSFET 110 is also known as the "Y-pass device." The gate of first MOSFET 110 is connected to $Y_N$ input 115, as discussed below. YN input 115 is operatively connected to the output from the Y-decoder. The operation and function of first MOSFET 110 is discussed in greater detail below. First MOSFET 110 is an enhancement device. The drain of first MOSFET 110 is connected to sense amplifier 120. The drain of first MOSFET 110 is further connected to the source of second MOSFET 130 and to the drain of third MOSFET 140. Second MOSFET 130 and third MOSFET 140 are enhancement type devices. The drain of second MOSFET 130 is connected to $V_{CC}$ 150. The gate of second MOSFET 130 is connected to DATA compliment input 160. The source of third MOSFET 140 is connected to ground 170 while the gate of third MOSFET 140 is connected to DATA input 180. Thus, second MOSFET 130 and third MOSFET 140 comprise a means for impressing information onto bit line 100 to be stored in EEPROM memory cell means 90.

As is well known in the art, sense amplifier 120 is operatively connected to the drain of first MOSFET 110. Sense amplifier 120 is further connected to sense amplifier output 190. Sense amplifier output 190 is connected to an output buffer (not shown), as is well known in the art, which output buffer is used for detecting the output of the sense amplifier and thereby for further determining whether a particular hit is coded with a binary logical "1" or a binary logical "0". Sense amplifier 120 can be any sense amplifier, as is well known in the art. Sense amplifier 120, in operation, detects whether or not current is flowing in bit line 100 during the read mode, as discussed below.

Parasitic capacitance shown by capacitor 200 connected to bit line 100 through dashed lines and to ground 170 through dashed lines exists between bit line 100 and ground 170.

Bit line 100 is connected to flip-flop means 30 through fourth MOSFET 210. The gate of fourth MOSFET 210 is connected to input $L_D$ 220. Fourth MOSFET 210 is an enhancement type device.

Bit line 100 is further operatively connected to high voltage $V_{PP}$ 230 through fifth MOSFET 240 and sixth MOSFET 250. High voltage $V_{PP}$ 230 is supplied by a high voltage source, as is well known in the art. Such high voltage source may, for example, be a charge pump or other equivalent high voltage source. Fifth MOSFET 240 and sixth MOSFET 250 are enhancement type devices. The gate of fifth MOSFET 240 is connected to flip-flop means 30. The gate of sixth MOSFET 250 is connected to $O_{IP}$ input 260. Bit line 100 is connected to the source of fifth MOSFET 240. The drain of fifth MOSFET 240 is connected to the source of sixth MOSFET 250. The drain of sixth MOSFET 250 is connected to high voltage $V_{PP}$ 230.

Bit line 100 is further connected to false loading protection means 60 and EEPROM memory cell means 90. Each bit line 100 is connected to a separate false loading protection means 60 and a separate flip-flop means 30. Although not shown in the FIGURE, there is an EEPROM memory cell means 90 connected to bit line 100 for each word line in the EEPROM memory cell array. Hence, in a 256K bit memory array, which contains a 512 by 512 array of memory cells, there are 512 EEPROM memory cells 90 connected to bit line 100.

The FIGURE shows temporary storage means in the form of flip-flop means 30. While flip-flop means 30 is used in the presently preferred embodiment, it would be obvious to one skilled in the art that other equivalent temporary storage means may be used. For example, latches similar to flip-flop means 30 may be used.

In the presently preferred embodiment, flip-flop means 30 is located outside of the EEPROM memory cell array. Flip-flop means 30 is connected to bit line 100 through fourth MOSFET 210. Flip-flop means 30 is also connected to charge pump means 270. Charge pump means 270 may, for example, be the charge pump disclosed in the U.S. Pat. No. 4,511,811, or any equivalent charge pump. Charge pump means 270 is also connected to the gate of fifth MOSFET 240. Flip-flop means 30 may comprise first inverter 280, second inverter 290, and seventh MOSFET 300. Seventh MOSFET 300 is a depletion type device. Both the gate and source of seventh MOSFET 300 are connected to bit line 100 through fourth MOSFET 210. The gate and source of seventh MOSFET 300 are further connected to the input of first inverter 280. The output of first inverter 280 is connected to the input of second inverter 290. The output of second inverter 290 is connected to the drain of seventh MOSFET 300 and to charge pump means 270. The output of second inverter 290, the drain of seventh MOSFET 300, and charge pump 270 are all connected to the gate of fifth MOSFET 240. Other equivalent flip-flop means, as are well known in the art, may also be used.

EEPROM memory cell means 90 may comprise tenth MOSFET 360 and floating gate memory device 390. The drain of tenth MOSFET 360 is connected to bit line 100. The source of tenth MOSFET 360 is connected to the drain of floating gate memory device 390. The source of floating gate memory device 390 is connected to ARRAY $V_{SS}$ 330. The gate of tenth MOSFET 360 is connected to WORD LINE 400. The gate of floating gate memory device 390 is connected to the source of eleventh MOSFET 370. The drain of eleventh MOSFET 370 is connected to the source of twelfth MOSFET 380. The drain of twelfth MOSFET 380 is connected to SEL line 410. The gate of eleventh MOSFET 370 is connected to WORD LINE 400. The gate of twelfth MOSFET 380 is connected to $Y_{LN}$ input 420. Tenth MOSFET 360 is an enhancement type device. Eleventh MOSFET 370 and twelfth MOSFET 380 are depletion type devices. floating gate memory device 390 may be a tunnel-dielectric floating gate memory device as that disclosed in "A 64Kb CMOS EEPROM with On-Chip ECC," by Mehrotra, et al., 1984 IEEE International Solid-State Circuits Conference DIGEST OF TECHNICAL PAPERS (1984), pages 142-43 & 328, or an equivalent floating gate memory device as is well known in the art.

Having discussed the environment in which the preferred embodiment of the present invention operates, the presently preferred embodiment of the invention is now described. False loading protection means 60 is connected to bit line 100. False loading protection means 60 may comprise eighth MOSFET 310 and ninth MOSFET 320. Eighth MOSFET 310 and ninth MOSFET 320 are both enhancement type devices. The drain of eighth MOSFET 310 is connected to bit line 100. The source of eighth MOSFET 310 is connected to the drain of ninth MOSFET 320. The source of ninth MOSFET 320 is connected to ARRAY $V_{SS}$ 330. The gate of eighth MOSFET 310 is connected to LD input 220. The gate of ninth MOSFET 320 is connected to $Y_{LN}$ compliment input 350.

There is one $Y_{LN}$ input 420 and one $Y_{LN}$ compliment input 350 for each byte in the memory array. $Y_{LN}$ input 420 is the output of the byte-latch. $Y_{LN}$ input 420 goes high when the byte to which it corresponds is selected for page mode programming. That is, $Y_{LN}$ input 420 goes high when the byte corresponding to the particular Y decoder output $Y_N$ input 115, goes high during page mode loading. $Y_{LN}$ input 420 then stays high during the remainder of the page mode programming cycle. After page mode programming is completed, $Y_{LN}$ input 420 goes low and remains low until the byte is once again selected for page mode programming. $Y_{LN}$ input 420 is used because $Y_N$ input 115 only remains high during the loading sequence, when the byte corresponding to $Y_N$ input 115 is selected for loading. $\overline{Y}_{LN}$ input 350 is the compliment of $Y_{LN}$ 420.

LD input 220 goes high during the loading sequence, thereby indicating that the loading sequence is occurring. hence, if a particular byte on the page being loaded is not selected for loading, then $Y_{LN}$ input 420 corresponding to that particular unselected byte remains low during the entire loading sequence. Since $\overline{Y}_{LN}$ input 350 is the compliment of $Y_{LN}$ input 420, then if a byte on the page being loaded is not selected for loading, during the loading sequence ($\overline{Y}_{LN}$) input 350 is high. Thus, a means is disclosed for determining when no EEPROM memory cell means on the bit lines comprising a particular byte are selected for loading, namely if both LD input 220 and ($\overline{Y}_{LN}$) input 350 are high, then no EEPROM memory cell means have been selected for loading on the particular bit lines 100 comprising the particular unselected byte.

Operation of the Preferred Embodiment

This discussion looks first at the environment in which the presently preferred embodiment of the present invention operates. Then the false loading problem arising in that environment is discussed. Finally, the discussion focuses on the operation of the preferred embodiment of the present invention.

1. Writing "1"

Assume it is desired to store a binary logical high, or "1" in EEPROM memory cell means 90. By convention, when a logical "1" is stored in EEPROM memory cell means 90, negative charge has been placed on the floating gate of floating gate memory device 390 and floating gate memory device 390 therefore will not conduct when it is selected to be read. Likewise, by convention, when it is desired to place a binary logical low or "0" in EEPROM memory cell means 90, floating gate memory device 390 has positive charge stored on its floating gate and therefore floating gate memory device 390 will conduct when it is selected to be read, as discussed below.

In order to program EEPROM memory cell means 90, a three step writing sequence is undertaken load, clear, and write.

First, when it is desired to program one of the EEPROM memory cells operatively connected to bit line 100 with a logical "1", a logic "a" is loaded into flip flop 30 during a loading cycle, DATA input 180 goes high and ($\overline{DATA}$) input 160 goes low. Since DATA input 180 is connected to the gate of third MOSFET 140, when DATA input 180 goes high third MOSFET 140 conducts and the drain of first MOSFET 110 is connected to ground through third MOSFET 140. Likewise, since DATA compliment input 160 is connected to the gate of second MOSFET 130, when DATA compliment input 160 goes low, second MOSFET 130 does not conduct and the drain of first MOSFET 110 is not connected to $V_{CC}$ 150 through second MOSFET 130. Meanwhile, $Y_N$ input 115 goes high, thus allowing first MOSFET 110 to conduct. Also LD input 220 goes high allowing fourth MOSFET 210 to conduct. Thus, the input of first inverter 280 is connected to ground through fourth MOSFET 210, first MOSFET 110, and third MOSFET 140. This causes the output of first inverter 280 to go high, since ground is a logical low. This puts a high signal at the input of second inverter 290, which causes the output of second inverter 290 to o low. Since the gate and source of seventh MOSFET 300 are connected together, this low at the output of second inverter 290 is conducted through seventh MOSFET 300 to the input of first inverter 280. In this manner, a logic low is loaded into flip-flop means 30, corresponding to the logical high it is desired to program into in EEPROM memory cell means 90. By the end of the loading sequence, $Y_N$ input 115 and $L_D$ input 220 are both low, causing first MOSFET 110 and fourth MOSFET 210 to no longer conduct. Thus, second MOSFET 130 and third MOSFET 140, and flip-flop means 30 are isolated from bit line 100.

During the clear sequence, WORD LINE 400, $Y_{LN}$ input 420, and SEL line 410 are all at high voltage $V_{PP}$. WORD LINE 400 thereby holds the gate of tenth MOSFET 360 at high volt causing tenth MOSFET 360 to conduct. $Y_{LN}$ input 420 holds the gate of twelfth MOSFET 380 at high voltage $V_{PP}$, which therefore conducts since it is a depletion device and its drain is held at high voltage $V_{PP}$ appearing on line SEL 410. This puts high voltage $V_{PP}$ on the drain of eleventh MOSFET 370 which also conducts since it is a depletion device and its gate is held at high voltage $V_{PP}$ by WORD LINE 400. Thus, high voltage $V_{PP}$ is applied to the gate of floating gate memory device 390. Since ARRAY $V_{SS}$ is at approximately 0 volts during the clear sequence, this puts a strong positive voltage difference between the gate and source of floating gate memory device 390. This strong positive voltage on the gate of floating gate memory device 390, as compared to the source of the device, causes electrons to be attracted through the thin dielectric and onto the floating gate of floating gate memory device 390. Thus, during the clear sequence, negative charge is placed on the floating gate of floating gate memory device 390 and floating gate memory device 390 has a logic one written into it.

During the write sequence, $0_{IP}$ input 260 goes high and sixth MOSFET 250 therefore conducts. However, since the output of second inverter 290 is low, the gate of fifth MOSFET 240 is low and therefore fifth MOSFET 240 will not conduct. Thus, bit line 100 is still isolated from high voltage $V_{PP}$ line 230. The WORD LINE 400 for the page being written is at high voltage $V_{PP}$. Therefore, since WORD LINE 400 is connected to the gate of tenth MOSFET 360, tenth MOSFET 360 conducts. SEL line 410 is at 0 volts and $Y_{LN}$ input 420 is at high voltage $V_{PP}$. Since twelfth MOSFET 380 is a depletion device, it conducts putting 0 volts on the drain of eleventh MOSFET 370. Eleventh MOSFET 370 conducts since WORD LINE 400 holds the gate of eleventh MOSFET 370 at high voltage $V_{PP}$. Therefore, the gate of floating gate memory device 390 is at 0 volts. ARRAY $V_{SS}$ 330 is at a voltage approximately equal to ($V_{CC} - 1$) volts during the write sequence. This voltage difference between the source of floating gate memory device 390 and the gate of floating gate memory device 390 is not sufficient to drive the charge that has been stored on the floating gate of floating gate memory device 390 during the clear sequence out of the floating gate. Thus a "1" remains stored in floating gate memory device 390.

2. Writing a "0"

When writing a binary logical low, or "0" into EEPROM memory cell means 90, approximately 0 volts is placed on DATA input 180 and $V_{CC}$ (logic high) is placed on $\overline{\text{DATA}}$ input 160. Thus the gate of third MOSFET 140 is placed at approximately 0 volts and the gate of second MOSFET 130 is placed at $V_{CC}$. Therefore, third MOSFET 140 does not conduct and second MOSFET 130 does conduct. In this manner the drain of first MOSFET 110 is connected to $V_{CC}$ 150 and is isolated from ground 170.

Meanwhile, $Y_N$ input 115 goes high, to $V_{CC}$. Thus, first MOSFET 110 conducts and $V_{CC}$ 150 is connected to bit line 100. Also, LD input 220 goes high, which brings the gate of fourth MOSFET 210 high, which causes fourth MOSFET 210 to conduct, thereby placing the input of first inverter 280 in electrical contact with bit line 100. This further places the input of first inverter 280 in electrical contact with $V_{cc}$ 150 through first MOSFET 110 and second MOSFET 130. In this manner, the input of first inverter 280 is brought high.

Since the input of first inverter 280 is high, the output of first inverter 280 is low. Therefore the input of second inverter 290 is low and the output of second inverter 290 is high. Since depletion device seventh MOSFET 300 is connected in the circuit in such a manner as to conduct under these conditions, the high output of second inverter 290 is electrically connected through seventh MOSFET 300 to the input of first inverter 280. Therefore, a logic "1" is loaded into flip-flop means 30.

In the end of the loading sequence, as above, $Y_N$ input 115 goes low thereby cutting off first MOSFET 110 and isolating bit line 100 from the source of second MOSFET 130 and the drain of third MOSFET 140. Likewise, $L_D$ input 220 goes low thereby cutting off fourth MOSFET 210 and isolating bit line 100 from flip-flop means 30.

The clear sequence is undertaken as discussed above with respect to writing a "1", resulting in the storage of electrons on the floating gate of floating gate memory device 390.

During the write sequence, $0_{IP}$ input 260 goes high thereby placing a high logic level on the gate of sixth MOSFET 250 and biasing sixth MOSFET 250 to conduct. Now, since the gate of fifth MOSFET 240 is held high by the output of second inverter 290 and charge pump means 270, fifth MOSFET 240 is biased to conduct. Therefore, high voltage $V_{PP}$ line 230 is connected electrically through sixth MOSFET 250 and fifth MOSFET 240 to bit line 100.

WORD LINE 400 is at high voltage $V_{PP}$ at this time. Thus the gate of tenth MOSFET 360 is at high voltage $V_{PP}$, and tenth MOSFET 360 conducts placing the drain of floating gate memory device 390 in electrical connection with bit line 100. In this manner, high voltage $V_{PP}$ 230 is connected to the area under the tunnel dielectric of floating gate memory device 390. $Y_{LN}$ input 420 is at high voltage $V_{PP}$, thus putting the gate of twelfth MOSFET 380 at high voltage $V_{PP}$. SEL line 410 is low thus putting the drain of twelfth MOSFET 380 at approximately 0 volts. Therefore twelfth MOSFET 380 conducts and a logic low is placed on the drain of eleventh MOSFET 370. Since the gate of eleventh MOSFET 370 is held high by WORD LINE 400, eleventh MOSFET 370 conducts, thus placing a logic low at the gate of floating gate memory device 390.

In this condition, there is approximately 0 volts on the gate of floating gate memory device 390 and high voltage $V_{PP}$ on the drain of floating gate memory device 390. Furthermore, there is negative charge stored on the floating gate of floating gate memory device 390. Because of the strong positive voltage on the drain as compared to the gate of floating gate memory device 390, the electrons stored on the floating gate are attracted to the drain and they are thereby pulled through the thin dielectric onto the drain of floating gate memory device 390, thereby removing the negative charge from, and placing positive charge onto, the floating gate. In this manner, a "0" is stored in EEPROM memory cell means 90.

Thus, the environment in which the preferred embodiment of the present invention operates has been discussed. Next, the discussion turns to the false loading problem that arises in this environment.

3. The Read Mode and the False Loading Problem

During the read mode, LD input 220 is low, thereby causing fourth MOSFET 210 to not conduct and thus isolating flip-flop means 30 from bit line 100. If one of the bits on bit line 100 is selected to be read, then $Y_N$ input 115 goes high, and therefore first MOSFET 110 is allowed to conduct, electrically connecting sense amplifier 120 to bit line 100. Meanwhile, bit line 100 is placed at approximately 2 volts if a logic one has been read out of memory cell means 30.

When it is desired to "read" EEPROM memory cell means 90, word line 400 goes high, thereby allowing tenth MOSFET 360 to conduct. If a logic "1" has been programmed into EEPROM memory cell 90, then negative charge is stored on the floating gate of floating gate memory device 390. Therefore, floating gate memory device 390 will not conduct current the voltage on bit line 100 will be approximately 2 volts, and sense amplifier 120 does not detect a current flow through bit line 100 and EEPROM memory cell means 90. Sense amplifier 120 transmits through output 190 a signal corresponding to the existence of a logic "1" stored in EEPROM memory cell means 90.

If, however, EEPROM memory cell means 90 has a "0" stored, then there will be positive charge stored on the floating gate of floating gate memory device 390. Thus, floating gate memory device 390 will conduct and current will, flow through it during the read operation, since bit line 100 will therefore be at approximately zero volts since it is connected to ARRAY $V_{SS}$ 330 through tenth MOSFET 360 and floating gate memory device 390. Sense amplifier 120 will therefore detect current flow in bit line 100 and transmit through output 190 an appropriate signal indicating the storage of a logic "0" in EEPROM memory cell means 90.

Now, as discussed above, during the read operation bit line 100 is placed at approximately 2 volts if a logic one has been read. Since parasitic capacitor 200 exists between bit line 100 and ground 170, after the read mode bit line 100 it remains charged to approximately 1.8 to 2.0 volts. Then, if a write cycle follows a read cycle, and if EEPROM memory cell means 90 is not selected for loading while one or more other EEPROM memory cells on the same page are selected for loading, and further, if EEPROM memory cell means 90 contains a binary logical "1" stored in it, then it is possible during the following write cycle that EEPROM memory cell means 90 will be falsely loaded with a binary logical "0".

For the time being, ignoring the existence of false loading protection means 60, $Y_N$ input 115 remains low during the loading sequence assuming no EEPROM memory cell 90 on bit line 100 is selected for loading. Therefore, first MOSFET 110 does not conduct and bit line 100 is not electrically connected to sense amplifier 120, second MOSFET 130, or third MOSFET 140. The approximately 2 volts remains trapped on bit line 100 because of parasitic capacitor 200.

If flip-flop means 30 is storing a logical low, then it can be inadvertently flipped to store a logical high because of the voltage trapped on capacitor 200. During the load sequence, LD input 220 goes high, causing fourth MOSFET 210 to conduct. The approximately 2 volts trapped on bit line 100 by parasitic capacitor 200 thereby appears at the input of first inverter 280. Since depletion device seventh MOSFET 300 is a very weak conducting device, the trapped voltage appears on the input of first inverter 280, and is not brought down to a lower voltage by the low output of second inverter 290. Thus, the output of first inverter 280 goes low causing the input of second inverter 290 to be low, thereby causing the output of second inverter 290 to go high. In this manner, flip-flop means 30 is caused to load a false high corresponding to a false binary logical "0" to be stored in one of the EEPROM memory cell means 90 on bit line 100.

During the clear sequence, LD input 220 is low, and therefore flip-flop means 30 is isolated from bit line 100. Thus the clear sequence does not affect flip-flop means 30.

During the write sequence, essentially the same events as described above with respect to writing a "1" occur. In the present case, however, flip-flop means 30 is storing a high output, instead of the low output it should be storing. Thus, it falsely appears that it was intended to program a binary logical "0" into EEPROM memory cell means 90 (corresponding to a high output in flip-flip means 30) during the write sequence. In fact, since flip-flop means 30 has a high output, a logical "0" is programmed into EEPROM memory cell means 90 as discussed above with respect to writing a "0".

4. The Operation of the False Loading Prevention Means

Having discussed the environment in which the present invention operates, and the false loading problem, this discussion now turns to the operation of the preferred embodiment of the present invention. It would be apparent to one skilled in the art that although the present preferred embodiment of the present invention is described herein, other embodiments of the present invention are also possible.

In order to prevent the false loading of erroneous information described above, false loading prevention means 60 is employed. Again, if a write cycle follows a read cycle in which charge has become trapped by capacitor 200, and if the output of flip-flop means 30 is low, then when the load sequence begins and none of the EEPROM memory cell means connected to bit line 100 are selected for programming, the $Y_N$ input 115 remains low and sense amplifier 120, second MOSFET 130, and third MOSFET 140 are isolated by first MOSFET 110 from the charge trapped on bit line 100. Also, LD input 220 goes high causing fourth MOSFET 210 to conduct, thereby electrically connecting flip-flop means 30 with bit line 100.

Again, the voltage trapped on bit line 100 by capacitor 200 is felt at the input of first inverter 280 and at the gate and source of seventh MOSFET 300. However, according to the present invention, a mechanism is provided that operates to discharge during the load sequence any voltage that remains on the bit line after a read cycle, if no cell on the bit line has been selected for programming. Thus, false loading prevention means 60 operates to prevent a "1" from being falsely loaded into flip-flop means 30.

When $Y_N$ input 115 remains low because none of the EEPROM memory cell means connected to bit line 100 have been selected, ($\overline{Y}_{LN}$) input 350, which is the compliment of $Y_{LN}$ input 420, remains high. Thus, the gate of ninth MOSFET 320 is held high and ninth MOSFET 320 conducts. When LD input 220 goes high, this causes the gate of eighth MOSFET 310 to go high thus causing eighth MOSFET 310 to conduct. In this manner, bit line 100 is electrically connected to ARRAY $V_{SS}$ 330. At this point in time, ARRAY $V_{SS}$ 330 is at ground.

Seventh MOSFET 300 is a very weakly conducting device, much more weakly conducting than false loading prevention means 60. Now, since fourth MOSFET 210 is biased to conduct, the voltage trapped on bit line 100 is felt at the input of first inverter 280. This trapped voltage is high enough to cause first inverter 280 to trip over and output a low. This causes a low input at second inverter 290, which therefore outputs a high that is felt at the input of first inverter 280. However, this high output at second inverter 290 is only temporary. False loading prevention means 60 provides a path (through eighth MOSFET 310 and ninth MOSFET 320) to discharge capacitor 200. Since seventh MOSFET 300 is much more weakly conducting than false loading prevention means 60, the input of first inverter 280 will be brought low and the output of first inverter 280 will therefore go high. In this manner, the input to second inverter 290 is brought high and the output of second inverter 290 will be returned to low, and therefore the output of flip-flop means 30 returns to low as desired.

Thus an apparatus for page mode programming of an EEPROM memory cell device with false loading protection has been disclosed. Although the preferred embodiment discloses a means of constructing the apparatus using N-channel technology, it would be obvious to one skilled in the art that CMOS or P-channel technology could be used as well.

While the foregoing has described in detail one embodiment of the present invention, it will be appreciated that, given the teachings herein, numerous equivalents and alternatives which do not depart from the present invention will be apparent to those skilled in the art, and those alternatives and equivalents are intended to be encompassed within the scope of the appended claims.

What is claimed is:

1. An apparatus for preventing false loading of information into a temporary storage device operative during page mode programming of a memory cell array, wherein said temporary storage device is operatively connected to a bit line connected to a plurality of memory cells, including:

a first transistor and a second transistor, said first transistor having a drain connected to said bit line and a source connected to a drain of said second transistor, a source of said second transistor connected to a source of voltage to which said bit line is to be discharged, said first transistor having a gate connected to a signal which renders said first transistor conductive during a page mode programming loading sequence for said memory array and said second transistor having a gate connected to a signal which renders said second transistor conductive when no memory cell associated with said bit line has been selected for programming.

* * * * *